United States Patent

Yao et al.

[11] Patent Number: 6,107,622
[45] Date of Patent: Aug. 22, 2000

[54] CHEVRON CORRECTION AND AUTOFOCUS OPTICS FOR LASER SCANNER

[75] Inventors: Shi-Kay Yao, Placentia, Calif.; John M. Tamkin, Oro Valley, Ariz.

[73] Assignee: Etec Systems, Inc., Hayward, Calif.

[21] Appl. No.: 09/092,319

[22] Filed: Jun. 5, 1998

Related U.S. Application Data

[60] Provisional application No. 60/051,974, Jul. 8, 1997.

[51] Int. Cl.[7] .............................. H01J 3/14; G02B 27/17
[52] U.S. Cl. .......................................... 250/235; 359/220
[58] Field of Search .................................. 250/234–236; 359/216, 220

[56] References Cited

U.S. PATENT DOCUMENTS

| | | | |
|---|---|---|---|
| 4,025,154 | 5/1977 | Yuta | 359/216 |
| 4,154,507 | 5/1979 | Barr | 359/220 |
| 4,729,071 | 3/1988 | Solomon | 359/220 |
| 4,777,568 | 10/1988 | Solomon | 359/220 |
| 5,018,808 | 5/1991 | Meyers et al. | 350/6.91 |
| 5,170,278 | 12/1992 | Wada et al. | 359/216 |
| 5,343,029 | 8/1994 | Katoh et al. | 359/216 |
| 5,383,047 | 1/1995 | Guerin | 359/209 |
| 5,416,319 | 5/1995 | Messena | 250/235 |
| 5,438,449 | 8/1995 | Chabot et al. | 359/216 |

FOREIGN PATENT DOCUMENTS

| | | | |
|---|---|---|---|
| 0 686 862 | 12/1995 | European Pat. Off. | G02B 26/10 |
| 6-202019 | 7/1994 | Japan | G02B 26/10 |

*Primary Examiner*—Stephone B. Allen
*Attorney, Agent, or Firm*—Skjerven Morrill MacPherson LLP; David T. Millers

[57] ABSTRACT

In a light raster scanning system imaging a medium located on a movable stage and using bidirectional scanning, i.e. scanning during stage movement in two opposing directions, the problem of chevron artifacts (angle errors), due to the different stage movement directions, is overcome by a system of reflective optics including two optical elements dynamically movable relative to one another. One of the optical reflective elements is tilted or rotated relative to the other to compensate for the angle error causing the chevron artifacts. The amount of this tilt is dynamically altered depending on the direction of stage travel and also may be dynamically adjusted to maintain linearity of the scan pattern in spite of any other irregularities in stage velocity. Also an autofocus feature is provided, whereby the two reflective elements are moved relative to one another to dynamically alter the focus of the light beam onto the medium and hence overcome any defocus problems due to irregularities in the medium surface.

19 Claims, 3 Drawing Sheets

CHEVRON CORRECTION AND AUTOFOCUS OPTICS FOR LASER SCANNER

CROSS REFERENCE TO RELATED APPLICATION

This application claims the benefit of the filing date of U.S. provisional application Ser. No. 60/051,974 filed Jul. 8, 1997.

BACKGROUND OF THE INVENTION

1. Field of the Invention

This invention relates to imaging in a scanning system and more specifically to bidirectional stage travel in a serpentine pattern in a raster scanning imaging system, and a method for correction for chevron error which occurs in such systems, as well as an auto focus mechanism for such systems.

2. Description of the Prior Art

Raster scanning is well known and is used e.g. for imaging on a television screen. In raster scanning a beam is scanned horizontally across the surface of the medium (the TV screen) to be imaged. The beam is typically turned on and off in order to define pixels of an image or absence thereof at any particular point. At the end of each scan line the beam is returned to the beginning of the next line without scanning so all "writing" (imaging) is in one scan direction.

For applications such as television, at the end of each scan line the beam is translated vertically (orthogonal to the fast horizontal scan direction) by a small amount in order to reach the next scan line.

In other applications (laser beam scanning) it is not easy to vertically translate the beam itself, so instead the medium is moved vertically, i.e. in the direction orthogonal to the laser beam scan direction (the fast scan direction). This is illustrated in present FIG. 1 where the medium is supported on a movable platform (a stage) which is not shown and the X and Y axis respectively indicate the scan direction, in this case of a laser beam, and the stage travel direction. This is called unidirectional printing since the stage only moves in one direction. The dotted lines indicate the return path at the end of each scan line. Thus in unidirectional printing the laser (or other beam) scans in what is defined as the X horizontal direction and the substrate is moved on its stage in one of the perpendicular vertical (Y axis) directions, for instance the +Y direction.

In the case where the stage travels in small steps taking a time less than the "fly back" time needed for the laser beam return path (dotted line) at the end of each scan line, it is of course trivial for the scan lines to be perfectly located at an angle 90° to the direction of stage motion. However in another case where the stage travels at constant speed in the Y direction while the beam scans orthogonally to the stage travel direction, then the scan lines will exhibit a small angle error γ as shown in FIG. 1, where the direction of the scan is slightly downwards and to the right. This is referred to as an angle error γ. Regarding the scan lines in the right portion of FIG. 1, these indicate the next scan field which is undertaken as a separate scan path; however, the features written in this next scan field are intended to be continuous with the left scan field.

In case of unidirectional printing, at the end of each stage travel path, the stage must be returned back to its starting position, side stepped to the left by distance L (thus bringing the right portion of FIG. 1 to the left for illumination by the scanning laser beam or laser beams), before starting the next travel path in the same y direction again. In FIG. 1, L is the length of one scan; ΔT is the time per scan line; if v is stage velocity, then γ=d/L=ΔTv/L.

The angle error which occurs with the unidirectional printing of FIG. 1 is a constant value γ for the entire image area and is easily overcome by a small rotation in the laser scan line relative to the medium. This is easily accomplished so as long as the stage travel velocity is a constant (constant both in magnitude and in direction). However, a more complex situation occurs (as illustrated in FIG. 2) where the stage travel is bidirectional or nonconstant. In this bidirectional printing, at the end of each scan field, rather than the stage returning to the bottom of the next (adjacent) scan field, the stage begins to translate in the opposite direction (from top to bottom, i.e. the −Y direction) for the next scan field after side-stepping a distance L.

FIG. 2 therefore shows the situation where in the left field the stage direction of movement is upwards, i.e. along the +y axis going away from the origin, whereas for the adjacent scan field shown in the right portion of FIG. 2, the direction of stage travel is in the opposite direction. Under these circumstances the angle error changes polarity for adjacent stage travel paths, or raster imaging fields. It cannot be eliminated at all times with simple rotation of the scan direction of the laser beams. Since such bidirectional stage travel is highly desirable in a laser scanning system in order to increase throughout, i.e. to reduce stage travel time, then chevron or herringbone shaped artifacts occur in adjacent fields. This can be seen with reference to FIG. 2 by understanding that each line ideally is a straight line continuously over two scan fields as shown in FIG. 1. However, in the case of FIG. 2 it can be seen each line that crosses the raster imaging field border is actually a shallow "V" rather than the desired straight line, due to the junction between two adjacent but oppositely scanned fields. A group of these shallow V's forms a so-called chevron pattern or herringbone pattern which is an undesirable artifact due to the angle error γ.

Another problem encountered sometimes in raster scanning is focussing of the laser beam on the medium. The medium, e.g. a printed circuit board substrate or a flat panel display substrate, may not have a perfectly flat surface due to manufacturing irregularities. These uneven portions of the surface may cause defocussing of the incident laser beam, thus reducing image quality. It would be useful to be able to overcome this focus problem also.

SUMMARY

In accordance with this invention, the chevron artifacts, i.e. the angle errors caused by bidirectional printing or by any nonconstant velocity stage travel, are overcome by dynamic (changing) rotation of the laser scan line in terms of its position on the medium. This is accomplished in one embodiment by providing two spaced apart sets of reflective surfaces (mirrors) including a folding path, where one of the two sets of reflective surfaces is dynamically rotatable or tiltable relative to the other. This overcomes the chevron problem caused by bidirectional stage travel at uniform speed, as well as any irregularities in the stage travel velocity for instance due to imperfections in the stage drive mechanism. A control system is provided to measure the velocity of the translating stage and to dynamically provide the desired rotation of the scan line to eliminate any artifacts due to nonuniform stage speed and its resultant variable angle error γ.

A related but separate mechanism provides focussing correction by means of an autofocus (feedback focus), wherein the two sets of reflected surfaces in the folding path are translated relative to one another under feedback control, thus providing autofocussing onto the medium.

While the present disclosure is directed to a laser scanning system, it is to be appreciated that it is not so limited, and includes scanning optical systems using not only visible, infrared and ultraviolet light but other types of radiation. That is, it is generally applicable to a raster scanning system where the medium is moved in a direction orthogonal to the scan direction having nonconstant relative motion of the medium relative to a source of the scanning beam.

In one embodiment the present chevron correction and auto focus are used in conjunction with a scan lens and relay optics (to increase working distance) as disclosed respectively in copending U.S. patent application Ser. No. 09/082,433, now abandoned, entitled "Anamorphic Scan Lens for Laser Scanner", by John M. Tamkin, and Ser. No. 09/082,434 entitled "High Efficiency Laser Pattern Generator", by John M. Tamkin, both incorporated by reference, but is not so limited. In one embodiment the relay optics disclosed in the above referenced application are interposed between the scan lens which forms and scans the laser beam(s) and the chevron correction and autofocus optics. However the use of the relay optics is not necessary and indeed the present chevron correction and autofocus may be accomplished upstream of the relay optics, i.e. performed on the beam before it passes through the relay optics or performed in the absence of any relay optics.

DETAILED DESCRIPTION

Figure 3A:
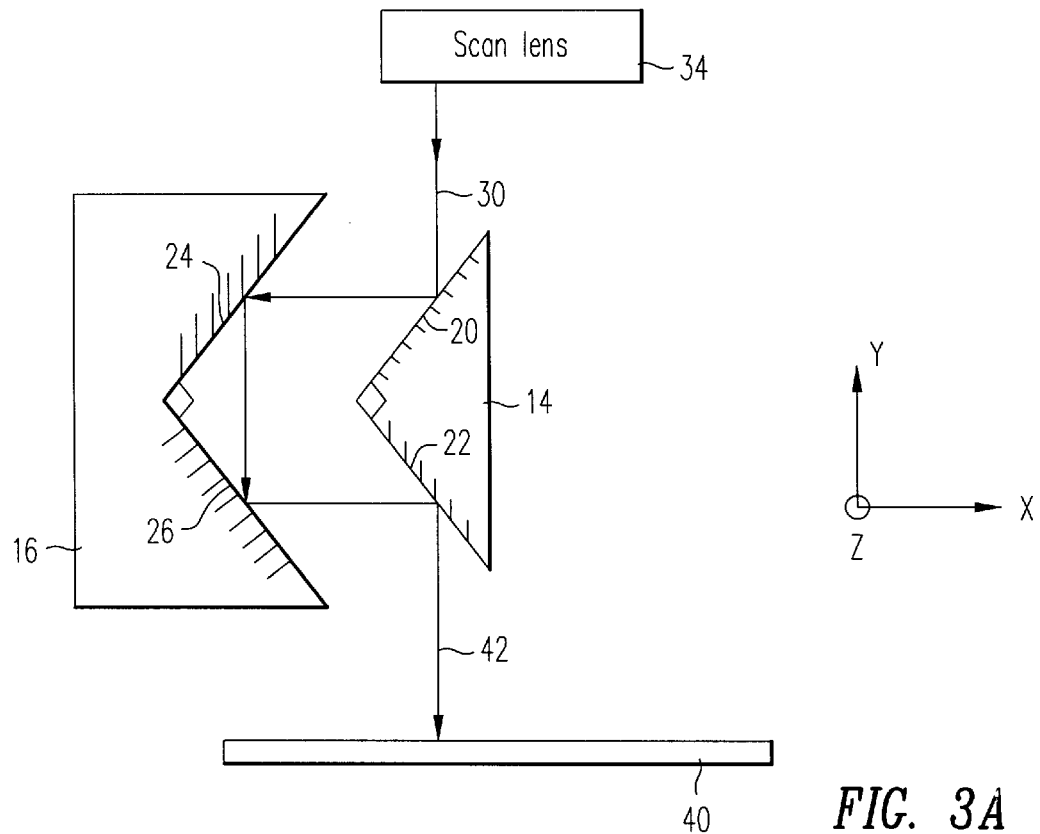
FIG. 3A shows reflective optics to perform chevron correction and focussing in accordance with this invention.

FIG. 3A shows in a side view a reflective optical system for providing scan line angle error (chevron) correction in accordance with this invention and also for dynamically focussing the beam on the medium. It is to be understood that FIG. 3A shows only the optical elements and beam rays and not the associated mountings or drive mechanisms. Each optical element 14, 16 which is of e.g. glass subtends an internal right angle (90°) as shown and includes a respective set of reflective surfaces 20, 22, or 24, 26. In one embodiment the present optics are used in a laser beam optical scanning system where the laser beam is in the ultraviolet spectrum, and hence the reflective surfaces 20, 22, 24, 26 are reflective of ultraviolet radiation, but this is of course not limiting. The angle of 90° is maintained to within e.g. ±3/10 milliradians in order to provide a 1/20th pixel diameter accuracy at the image plane for one specific example of raster scanning system. (The pixel is the diameter of the beam at the medium.) Moreover each reflective surface 20, 22, 24, 26 should be optically flat, e.g. to within 1/4 of a wavelength of the incident beam radiation for one specific example of system. These numerical parameters are not limiting.

FIG. 3A shows the incident radiation (beam) 30 from, in this case, a scan lens 34 not shown in detail but e.g. as described in the above-referenced application. The scan lens 34 provides the actual scanning movement of the beam; such scan lenses in general are well known. In one embodiment relay optics (not shown) as described in the above-referenced application are interposed between the scan lens 34 and the present chevron correction optics. The relay optics alternatively are present downstream of the chevron correction optics, or not present at all. The relay optics, as described in the above-referenced application, increase working distance or change the laser beam diameter. Therefore the present chevron correction may be applied, in terms of the location of optical elements 14, 16, either prior to passage of the light beam through relay optics, or in the absence thereof immediately above the image point, i.e. immediately above the medium or at an intermediary image plane.

The incident radiation 30 reflects from the first reflective surface 20 of the first optical element 14 and then onto the first reflective surface 24 of the second optical element 16, onto the second reflective surface 26 of the second optical element 16, and then onto the second reflective surface 22 of the first optical element 14, and then to the medium 40. As can be seen in the position of FIG. 3A, the two optical elements 14, 16 in FIG. 3A are arranged to have no effect on the beam 30, i.e. the incident beam 30 from the scan lens is co-linear to beam 42, that is identical in both location and angle to the beam 42 transmitted to the medium 40. Hence FIG. 3A depicts the neutral position.

It is to be understood that while in FIG. 3A the first and second reflective surfaces for each optical element 14, 16 are depicted as formed on a single monolithic substrate, this is only one embodiment. Placing both reflective surfaces on a single substrate makes it easier to achieve the 90° angles but this is not required, and in one embodiment the second optical element is two separate pieces bonded together. However, the pieces need not be bonded together, so long as they are held at the proper angle.

Figure 3B:
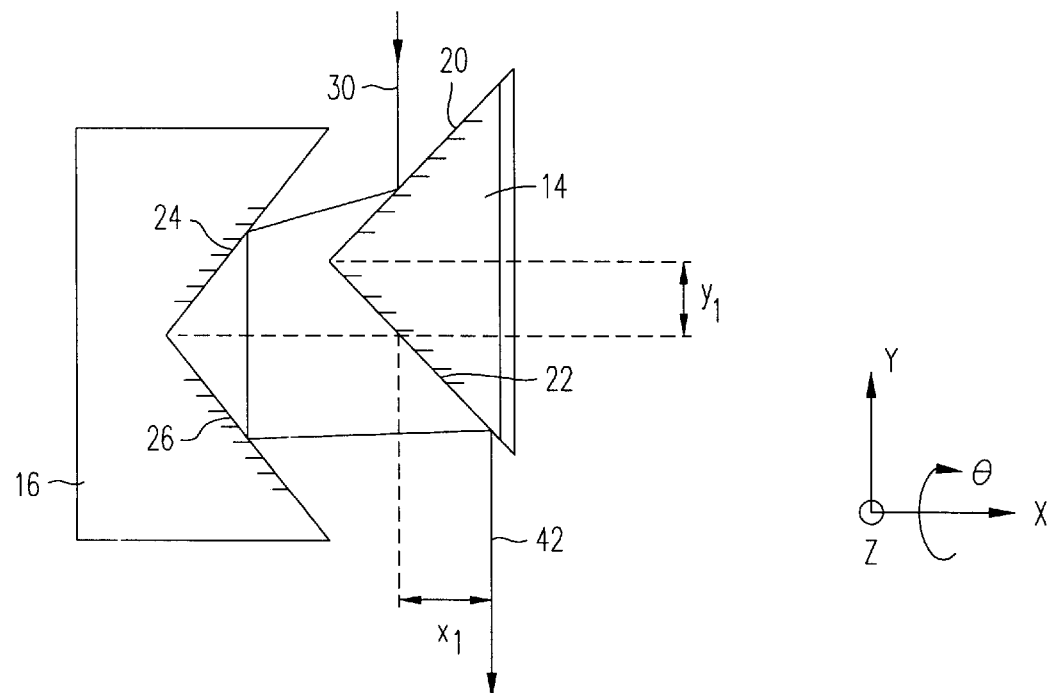
FIG. 3B shows use of the optics of FIG. 3A for chevron correction.

The improvements in accordance with this invention are accomplished by moving the two optical elements 14, 16 of FIG. 3A relative to one another. For purposes of the chevron correction, the optical element 14 is rotated about the depicted x-axis relative to the optical element 16 as shown in FIG. 3B. The amount of rotation shown is exaggerated for clarity. As can be seen in FIG. 3B, the rotation of element 14 about the x-axis produces a displacement of the reflective surfaces 20, 22 in the +y direction an amount of $z_1 \tan \theta$ in which $z_1$ is the location along the z-axis where the FIG. 3B view is located. This provides the altered beam path 42 as shown in FIG. 3B, with the beam 42 reflected from the second reflective surface 22 of the first optical element 14 being displaced along the x-axis direction an amount of $2z_1 \tan \theta$.

The dependence of such x-axis displacement on $z_1$ clearly means a tilt (or rotation about the y-axis) of the scan line at an angle of approximately $2\theta$. Thus, by letting $\theta=\pm\gamma/2$, while the stage travel changes direction, the angle error $\pm\gamma$, can be corrected by this mirror mechanism.

While in this case the first optical element 14 is shown rotated, the important thing is the relative inclination of the two optical elements 14, 16. Thus the same result is achieved by keeping the first optical element 14 fixed and rotating the second optical element 16 about its x-axis in the opposite direction. Of course such an inclination is not useful in overcoming the above described chevron artifact problem with bidirectional printing if the two optical elements 14, 16 were merely fixed in this inclined position.

In accordance with the invention the amount of inclination is dynamically variable, i.e. is changed during printing (imaging). Thus the amount of inclination is altered, for instance at the end of each scan field during bidirectional printing to be in the opposite direction of inclination, in order to eliminate the chevron artifacts and provide all of the scan lines with the desired orthogonality to the direction of scan, or at least so that they are all parallel from field-to-field, without the chevron artifact.

The mechanism for achieving this dynamic inclination of the two optical elements 14, 16 relative to one another is described below in greater detail but can be accomplished by a number of structures responding to the commands which drive the stage supporting the medium. Hence in one embodiment coordination is required between the direction of the stage movement in terms of bidirectional printing and the inclination of the optical elements 14, 16, as understood by one of ordinary skill in the art.

Figure 1:
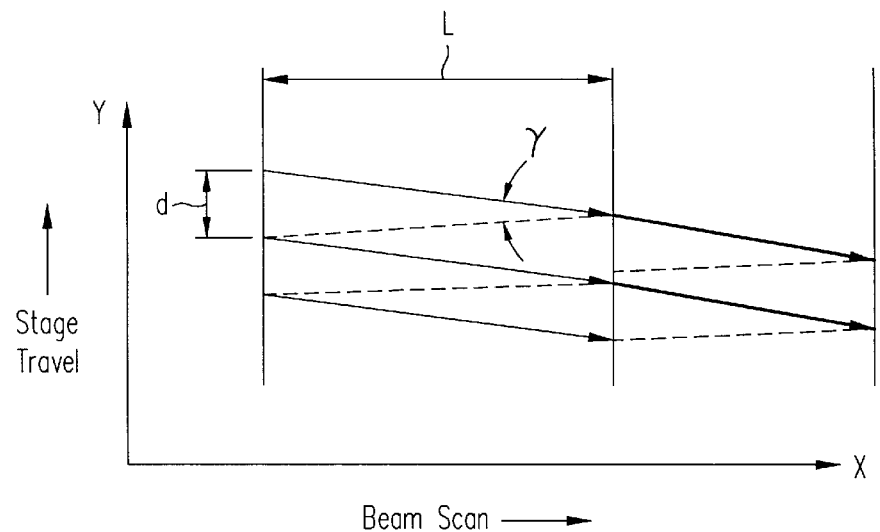
FIG. 1 shows unidirectional printing in the prior art.
Figure 2:
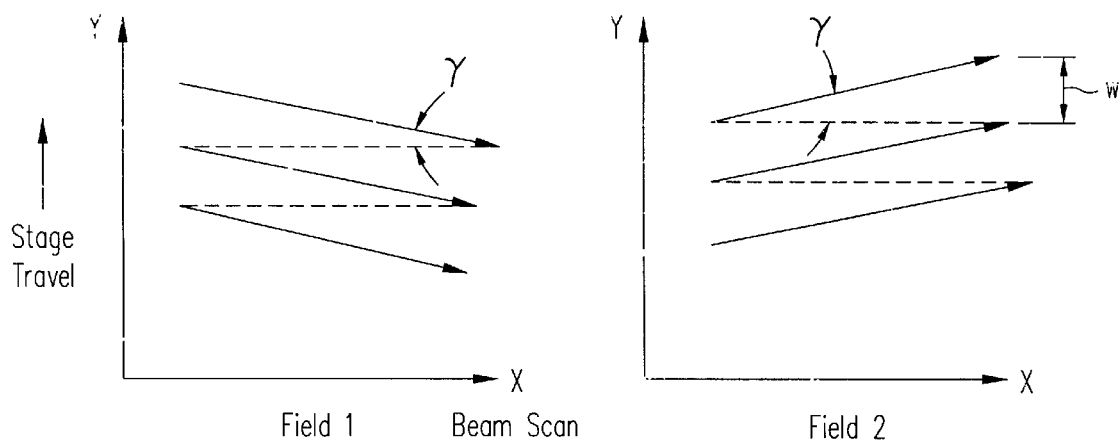
FIG. 2 shows bidirectional printing as known in the prior art and which illustrates the chevron problem addressed by the present invention.

Thus when the first optical element 14 is inclined (rotated) about the x-axis by an amount $\theta$, the output scanning beam will rotate to the right by an angle of $2\theta$. In this case, $x_1 = 2y_1 = 2z \tan \theta$. However the optical path length remains the same, thus maintaining focus. In case the scanning laser beam is composed of a group of independently modulated laser beams, i.e. a beam brush, the value d of FIG. 1 will be the beam brush width $W_1$ which equals $N\delta$, where N is the number of channels (beams) and $\delta$ is the spacing between adjacent laser beams. For chevron correction the optical element is inclined an amount $\pm\theta$ such that $\pm L\theta$ is equal to one half of the beam brush width. This rotation about the x-axis results in a rotation of the output scanning line for chevron correction of $\pm\gamma$.

As described above, a separate problem is also solved in accordance with this invention, that of focussing the beam on a medium having an irregular surface (less than absolutely planar). In applications such as imaging laminated substrates to be used for printed circuit boards or display device substrates, the planarity of the substrate is not so assured, so dynamic focusing while imaging is often desired.

Figure 3C:
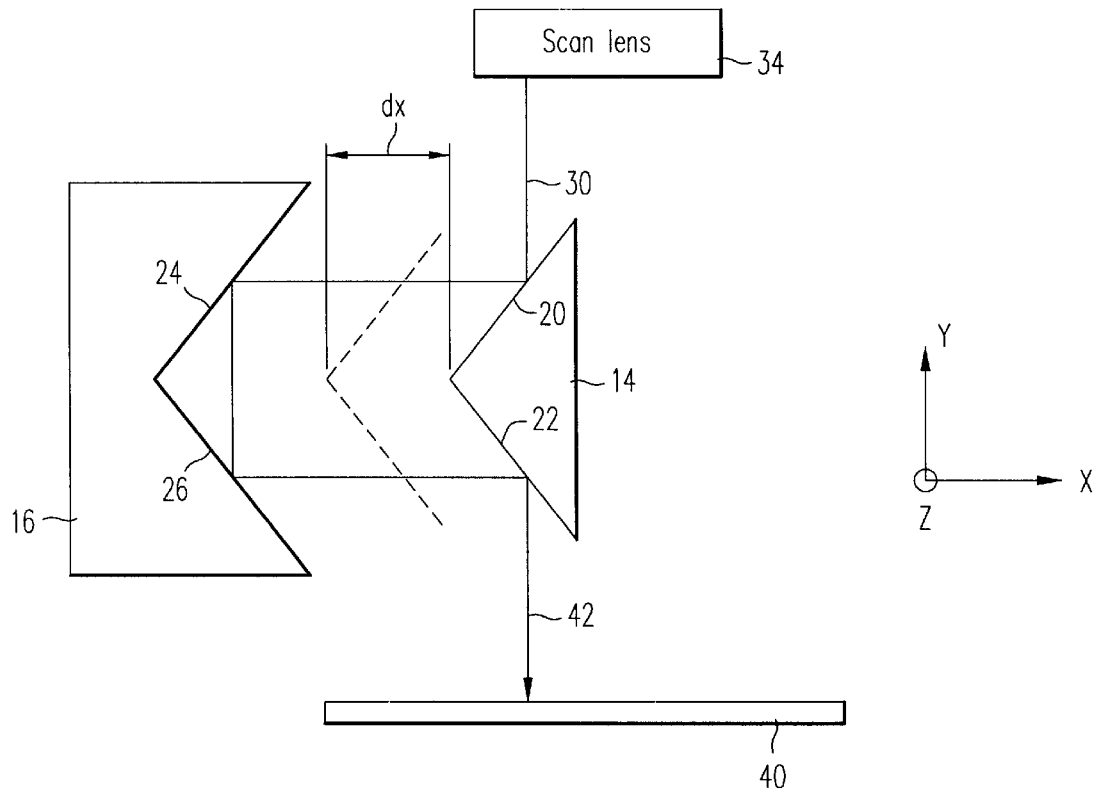
FIG. 3C shows use of the optics of FIG. 3A for focussing.

In this case the present inventors have found that it is advantageous to provide an autofocussing function using the same optical elements arranged as in FIG. 3A. In this case, as shown in FIG. 3C, the two optical elements 14, 16 are not rotated or tilted but instead are translated, i.e. moved relative to one another along the depicted x-axis. As readily understood from FIG. 3C showing the first optical element 14 in two different positions, which are the neutral position of FIG. 3A (dotted line) and an extended position, in the extended position the length of the optical path is increased by a translation of the first optical element dx by distance 2dx. This is easily understood geometrically because the beam must transverse this displacement dx twice between the first and second reflective elements. Hence by letting the optical axis remain stationary, the optical path length increases. This allows adjustment of optical path length between the scan lens and the substrate surface and thus provides the focusing mechanism.

It is to be understood that the required amount of x-axis direction motion for focussing is very limited and is for instance $\pm 1$ mm to achieve a focussing depth of $\pm 2$ mm. The amount of tilting or rotation needed for chevron correction to correct for bidirectional printing chevron angle error is only a fraction of a minute of arc and hence the drawings are intendedly exaggerated to better show this motion and inclination and are not to scale. Typically for the x-axis translation, one of the optical elements 14, 16 is held stationary and the other is translated along the x-axis. Again, which optical element is translated is not relevant in an optical sense but the relative x-axis translation provides the focussing effect. In one embodiment both elements 14, 16 are translated different amounts although this is more complicated mechanically.

Hence by dynamically translating the optical elements 14, 16 relative to the other, one can dynamically focus the beam and compensate for irregularities in the surface of the medium 40. This requires determining dynamically the nature of these irregularities, such as by a medium surface irregularity detector. In one embodiment this detector includes a laser displacement transducer (not shown) which senses the location of the surface of the medium. This uses an auxiliary laser beam which tracks ahead of the scanning beam looking for irregularities in the surface by sensing defocussing of the reflected auxiliary laser beam, and in response controls the relative translation of the first and second reflective elements with the desired time lag built in, to compensate for the currently encountered irregularities in the medium surface by the scanning beam.

The last type of movement of the optical elements, with reference to FIG. 3A, is a relative displacement of the two optical elements along the y-axis. This would not affect the error angle or the focus but instead displaces the scan line in the x-axis direction. While this might be of use in some applications such as alignment, it is not directly pertinent to either the chevron correction or focussing.

It is to be understood that various mechanical mounting arrangements and drives may be used to achieve the above described relative movements of the two optical elements of FIG. 3A. One version shown in FIG. 4 fixes the first optical element 14 on a rigid mounting (not shown); only the second optical element 16 is movable. In this case the second optical element 16, for purposes of economy of fabrication, is actually two separate mirrored elements 16-a, 16-b adhesively bonded together, with only the lower element 16-b then adhesively bonded to the mount structure 50. This thermally isolates the upper reflective surface 24 from the lower reflective surface 26 and also from the mechanical elements which are heat generating. In general it has been found to be desirable to isolate the reflective surfaces on both optical elements 14, 16 from any heat-producing elements in the system, i.e. electric motors.

Figure 4:
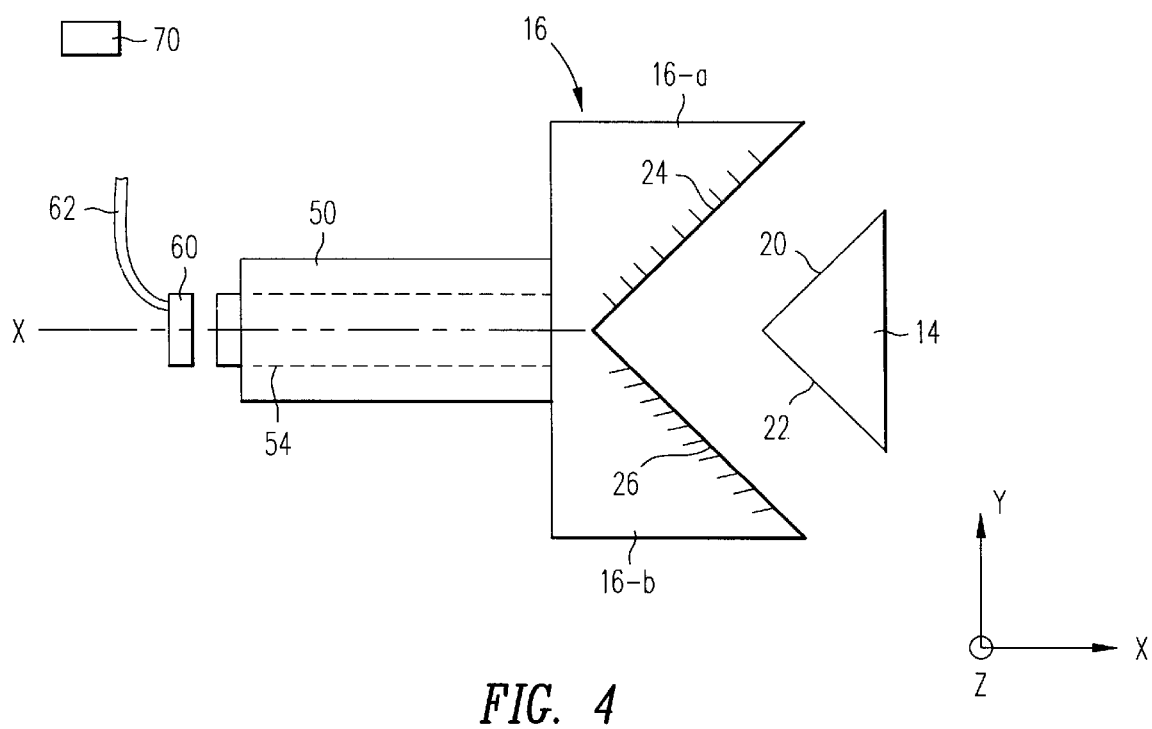
FIG. 4 shows a mechanical drive for the optics of FIG. 3A.

In this case as shown in the cross sectional drawing of FIG. 4, the lower reflective element 16-b of the second optical element 16 is mounted on the lower part of the mount structure 50 which in turn rides on a gimbal, i.e. a cylindrical structure, 54 riding in a fairly closely fitting corresponding gimbal hole extending through the mount structure 50. Thus the optical element 16 on its mounting structure 50 can rotate about the depicted x-axis relative to the cylindrical gimbal structure, to achieve the desired rotation of the optical element 16 relative to the optical element 14. Such gimbals are well known in the field of mechanical engineering and are not described further herein. It is of course important this be a relatively precise gimbal with minimum play so as to prevent unwanted motion of the second optical element 16. This rotation about the x-axis on the cylindrical gimbal structure 54 provides the desired tilting for chevron correction. The mount structure is actually driven relative to the cylindrical gimbal element by an electromagnetic actuator. The desired rotation and movement of the gimbal can be accomplished also by for instance a piezoelectric actuator, or a motor with a cam.

The above described translation movement along the x-axis is used for focussing. Again, in this case in one embodiment the second optical element 16 is moved and the first optical element 14 is held fixed but this is not limiting. In this case the back of the mounting structure 50 as shown in FIG. 4 has the capability to translate with the associated second optical element 16 back and forth along the x-axis relative to the cylindrical gimbal structure 54. Typically this x-axis translation is achieved by an air bearing 60 pushing against the rear surface of the mount structure 50. The air bearing 60 is spring loaded (not shown) so that the gimbal can return to its normal position in the absence of operation of the air bearing 60. Air bearing 60 is supplied by air via tube 62 to provide frictionless contact between bearing 60 and gimbal structure 54.

As part of the mechanical arrangements, it is useful to sense the exact position of the second optical element 16 relative to the first optical element 14 for control purposes. This is achieved for instance by e.g. sensors 70 mounted to sense the position (both in terms of rotation and translation) of the mounting structure 50 which holds the second reflective element 16. In one embodiment inductive sensors are used to detect the movement of this mounting structure both back and forth along the x-axis and also rotationally. In another embodiment the coarse rotational and translational movement are both detected by inductive sensors and in the fine range optical sensors are used. For the autofocus, i.e. translation, a laser diode/photosensor arrangement may be used to sense the position of the moveable optical element.

A more direct means of focus finding and chevron angle error correction is accomplished by e.g. a conventional charge coupled device (CCD) sensor (not shown) which monitors a split-off portion of the scanning beam prior to its being incident upon the medium. Thus a beam splitter is provided, for instance in the chevron correction mirror assembly optics, which splits off a small portion of the laser beam and directs it to the CCD sensor in order to measure motion of the beam relative to the stage travel via a control system and provide feedback control to rotate the second optical element.

This description is illustrative and not limiting; further modifications will be apparent to one skilled in the art and are intended to fall within the scope of the appended claims.

What is claimed:

1. A method of correcting angle error in a pattern scanned onto a medium, the method comprising:
   scanning a beam along a scan axis and onto a first reflective surface of a first reflective element;
   directing the beam reflected from the first reflective surface of the first reflective element onto the first reflective surface of a second reflective element that is substantially parallel to the first reflective surface of the first reflective element;
   directing the beam reflected from the first reflective surface of the second reflective element to a second reflective surface of the second reflective element and subsequently to a second reflective surface of the first reflective element;
   inclining the second reflective element relative to the first reflective element; and
   directing the beam reflected from the second reflective surface of the first reflective element towards the medium.

2. The method of claim 1, further comprising moving the medium in two opposite directions both orthogonal along the scan axis.

3. The method of claim 1, further comprising the step of translating the first reflective element relative to the second reflective element along an axis defined by the beam path between the first and second reflective elements, thus focusing the beam onto the medium.

4. The method of claim 1, wherein the beam when incident on the medium has a width W, and the second reflective surface is rotated about an axis parallel to the beam between the first and second reflective elements by an angle proportional to W.

5. The method of claim 3, further comprising the step of:
   sensing a distance to the medium; and
   wherein the translating step maintains the beam focussed on the medium in accordance with the sensed distance.

6. The method of claim 1, wherein the first and second reflective elements are two spaced apart right angle mirrors.

7. A scanning optical system for scanning a beam onto a medium, comprising:
   a scan lens for scanning the beam across the medium in a first direction;
   a support for the medium for moving the medium in a second direction orthogonal to the first direction;
   a first set of first and second reflective surfaces arranged perpendicular to one another;
   a second set of first and second reflective surfaces arranged perpendicular to one another and spaced apart and facing the first set, the first set and second set being arranged to receive the beam from the scan lens and to direct the beam towards the medium; and
   a mechanism coupled to at least one of the first and second sets for inclining the first and second sets relative to one another.

8. The system of claim 7, further comprising a translation mechanism coupled to at least one of the first and second sets for translating the first and second sets relative to one another.

9. The system of claim 7 wherein the second set of reflective surfaces is located on an angle of a structure.

10. The system of claim 9, wherein for the second set, the first reflective surface is on a first element and the second reflective surface is on a second element bonded to the first element.

11. The system of claim 7, wherein the mechanism includes a gimbal on which the second set of reflective surfaces is mounted.

12. The system of claim 8, wherein the translation mechanism includes an air bearing for translating the second set of reflective surfaces relative to a mount.

13. The system of claim 7, wherein the beam when incident on the medium has a width W, and each of the second set of reflective surfaces is rotated about an axis parallel to the beam between the first and second sets of reflective surfaces by an angle proportional to W.

14. The system of claim 7, wherein the mechanism tilts the first and second sets relative to one another.

15. The system of claim 7, wherein the mechanism rotates the first and second sets relative to one another.

16. A scanning method comprising:
   scanning a scan beam along a first axis;
   directing the scan beam into correction optics while scanning, wherein the correction optics comprise in order of incidence, a first reflective surface, a second reflective surface, a third reflective surface, and a fourth reflective surface, the first, second, third, and fourth reflective surfaces having neutral positions such that the scan beam when existing the correction optics is co-linear with the scan beam when entering the correction optics;

projecting the scan beam exiting from the correction optics on to a medium;

moving the medium relative to the scan beam, along a second axis while scanning the scan beam along the first axis; and adjusting an angle between the reflective surfaces in the correction optic so that the correction optics shifts the scan beam as required to compensate for moving the medium and thereby keeps the scan beam scanning along the first axis relative to a scanned surface of the medium.

17. The method of claim 16, wherein:

moving the medium comprises moving the medium in a first direction along the second axis, and then reversing directions to move the medium in a second direction along the second axis, the second direction being opposite to the first direction; and adjusting the angle comprises setting the angle to a first angle while the medium moves in the first direction, and setting the angle to a second angle while the medium moves in the second direction.

18. The method of claim 16, wherein in the correction optics, the first reflective surface is fixed perpendicular to the fourth reflective surface, the second reflective surface is fixed perpendicular to the third reflective surface, and a mounting of the reflective surfaces permits rotating of the first and fourth reflective surfaces relative to the second and third reflective surfaces to adjust the angle.

19. The method of claim 16, further comprising moving the first and fourth reflective surfaces relative to the second and third reflective surfaces to adjust the focus of the scan beam at the scanned surface of the medium.

* * * * *